United States Patent [19]
Jungfer et al.

[11] 3,971,980
[45] July 27, 1976

[54] BATTERY TESTING APPARATUS

[75] Inventors: Leopold Jungfer; Dieter Kautschitsch, both of Feistritz; Richard Weber, Klagenfurt, all of Austria

[73] Assignee: Firma Akkumulatorenfabrik Dr. Leopold Jungfer, Feistritz im Rosental, Austria

[22] Filed: Dec. 20, 1974

[21] Appl. No.: 535,201

[30] Foreign Application Priority Data
   Jan. 11, 1974  Austria .................................. 245/74

[52] U.S. Cl. ................................. 324/29.5; 320/48
[51] Int. Cl.² ...................................... G01N 27/42
[58] Field of Search ...................... 320/48; 324/29.5

[56] References Cited
   UNITED STATES PATENTS
   3,778,702  12/1973  Finger ................................ 324/29.5
   3,781,658  12/1973  Godshalk .......................... 324/29.5

Primary Examiner—R. V. Rolinec
Assistant Examiner—Michael J. Tokar
Attorney, Agent, or Firm—Ernest F. Marmorek

[57] ABSTRACT

Apparatus for indicating the charge condition of a secondary cell, comprising an integrating device which progressively sums the ampere-hours drawn from the cell, and a computer which is programmed to provide a voltage output whose magnitude indicates the total number of ampere-hours available, from the battery at the particular discharge current and temperature. A comparator subtracts from this a voltage derived in accordance with the output of the integrating device. The comparator output thus indicates the remaining ampere-hours available to be drawn from the cell at the prevailing conditions of discharge current and temperature. There may be provided a further computer which is programmed in accordance with the variation in minimum ampere-hour requirement of the cell to ensure that a particular load, e.g. a starting motor, can be successfully operated at various temperatures. This comparator can be arranged so as to provide an indication as to whether or not the charge condition of the cell is sufficient to operate this load.

8 Claims, 4 Drawing Figures

BATTERY TESTING APPARATUS

This invention relates to apparatus for indicating the charge condition of a secondary cell.

An electric motor used for starting an internal combustion engine temporarily requires substantial current, which in a motor vehicle is taken from a storage battery, i.e. the starter battery. Moreover, the starter battery frequently has to supply, during the service life of the internal combustion engine, other current-consuming appliances, e.g. radio receivers, lights, heaters and blowers. The energy consumed in starting, and other ampere-hours taken are fed back to the starter battery, when the internal combustion engine is operative, normally by a coupled electric generator.

It is, however, a peculiarity of secondary cells, in particular of lead batteries, that the amount of ampere-hours which can be taken becomes smaller as the current loading is greater. Consequently, if the starter battery is loaded with weak currents, then the loss of starting capability occurs some considerable time before the runningdown of the battery for the low current loading. Therefore a warning instrument is desirable, which gives prompt warning before the number of ampere-hours in the starter battery falls below the minimum required for starting.

Similarly in other applications, for example in traction batteries for electric vehicles, it is desirable to indicate the particular charge condition of a battery or the particular quantity of ampere-hours which can still be taken, so that it is possible to estimate the potential operating range of the vehicle even in the case of electric vehicles, just as is done using a fuel gauge in the case of motor vehicles with internal combustion engines.

For the indication of the charge condition of secondary cells, instruments are known, in which by measuring the specific gravity of the acid or the battery voltage (at no-load and under load) a reading is obtained regarding the charge condition. It is also known to indicate the charge condition of a secondary cell by positive/negative reading of the quantity of ampere-hours taken or charged, using a d.c. meter (analogue or digital reading). A combination of these two methods of measurement is also known.

The known methods and instruments are, however, inadequate in practice insofar as they do not sufficiently take into consideration the variations of the characteristics of secondary cells which occur as various factors change. Consequently, the specific gravity of the acid is dependent on temperature, the quantity of ampere-hours which can be taken is dependent on temperature and on the discharge rate of current, and the charging current input and the charging factor (efficiency) are dependent on temperature and on the back-potential of the secondary element. There results from this a non-linear or non-proportional characteristic of the secondary cells.

The residual capacity of the secondary cell, which is available in each case, cannot therefore be determined by simple differential measurement of the quantity of ampere-hours taken and charged, since in this case the nonlinear characteristic dependent on the loading and the temperature of the secondary element are not taken into consideration. The same also applies to the starting capability of secondary cells, which is likewise predominantly dependent on temperature and residual capacity.

The object of the invention is therefore to provide an instrument suitable for indicating the charge condition of secondary cells, said instrument taking into consideration the non-linear characteristic and the temperature dependence of the secondary cells, thereby to give a substantially more accurate indication of the quantity of ampere-hours or energy which can be taken.

According to the invention there is provided an apparatus for indicating the charge condition of a secondary cell, comprising a comparator coupled to receive on the one hand, an output signal from an integrating element capable of effecting a positive/negative measurement of the charging current and discharge current of the secondary cell, said output signal indicating the resultant ampere-hours consumption starting from a predetermined fully charged condition, and which comparator, on the other hand, is acted upon in dependence on a further output signal, which indicates the particular quantity of ampere-hours which can be taken, and which comes from a load-curve computer programmed for the relevant secondary cell, in accordance with the relationship between discharge current, temperature and the quantity of ampere-hours which can be taken, and arranged to be controlled in accordance with the particular discharge current and with the particular temperature of the secondary cell.

The comparator can, for example, determine and indicate the difference in the output signals from the load-curve computer and from the integrating element. The reading thus obtained is then a measure of the quantity of ampere-hours which can be taken in the case of the particular discharge current and at the operative temperature of the secondary element.

In particular with starter batteries for motor vehicles it is desirable to obtain a direct indication with regard to whether or not the charge condition of the secondary element at the particular operative temperature is capable of meeting a predetermined minimum ampere-hours requirement, this latter, which is required for a starting operation for example, being for its part also current and temperature-dependent. The output signal from the load-curve computer may therefore be applied to a compensating curve computer programmed in accordance with the combination of the predetermined minimum ampere-hours requirement at the particular temperature of the secondary element, the output signal from this latter computer acting on the comparator.

An embodiment of the invention will now be described by way of example, with reference to the accompanying drawings, in which:

FIG. 1 illustrates that the quantity of ampere-hours which can be taken from a battery decreases with increasing magnitude of discharge current and with decreasing temperature.

FIG. 2 shows that with decreasing temperature an increasing percentage of the rated capacity of the battery must be available for a starting operation in order to ensure starting capability. The characteristic curves shown in FIGS. 1 and 2 are utilised in the instrument of FIG. 3, as will be described in the following in greater detail, by means of curve computers of conventional design.

Figure 3A:
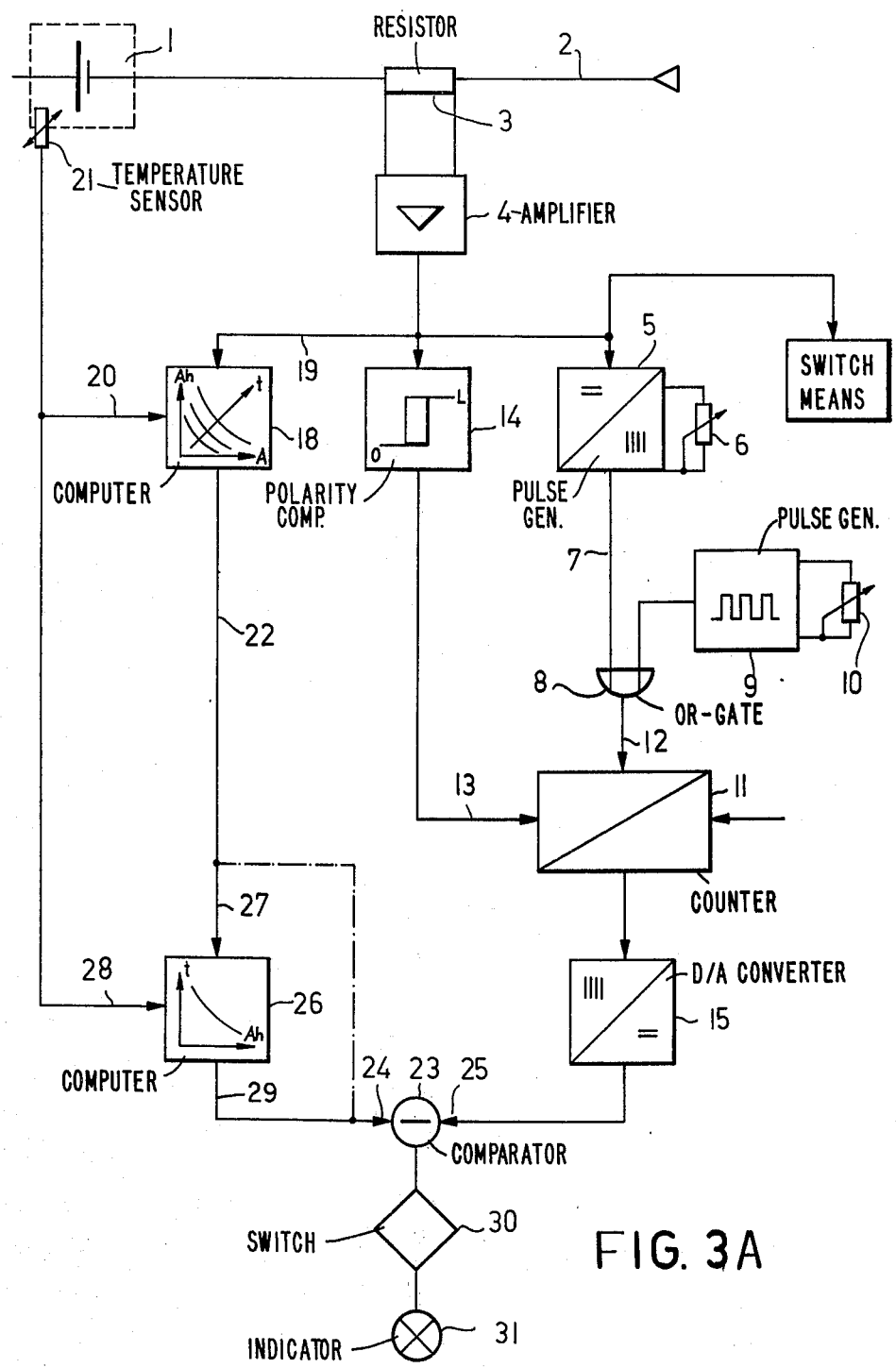
FIGS. 3A and 3B illustrate black diagrams embodying the invention.
Figure 3B:
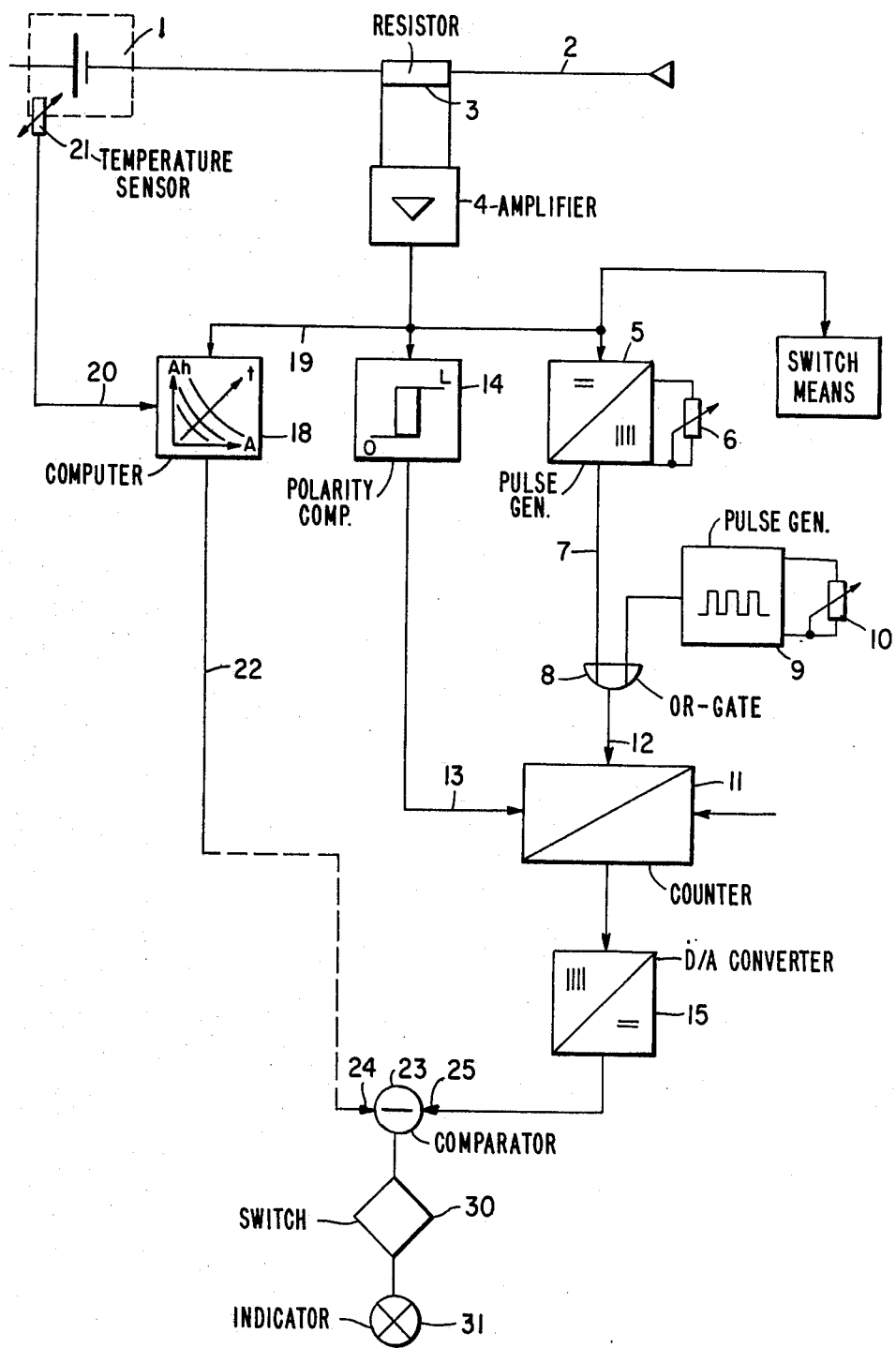

In FIG. 3 there is illustrated a starter battery 1, in whose circuit 2 there is located a small resistor 3, the voltage developed across this resistor being supplied to the input of a measuring amplifier 4. The output voltage of the measuring amplifier 4 is supplied to the control input of a voltage controlled frequency changer 5, which at its output delivers a pulse train having a frequency proportional to the magnitude of the voltage at the control input. The frequency changer 5, which may be of a conventional commercial type, has a control member 6 by means of which, in accord with the charge factor (efficiency) of the secondary element 1, the output frequency of the frequency changer 5 can be controlled in such a way that a current which charges the battery has an effect on the output frequency which is smaller than that of a discharge current of the same magnitude, by an amount corresponding to the charge factor. The output lead 7 of the changer 5 is applied to an input of an OR-gate 8, whose second input is connected to the output of a pulse generator 9, the pulse train from the latter being adjustable by means of a control member 10. Switching means 32 are provided for actuating the pulse generator 9, when the input voltage of the frequency changer 5 disappears, to produce a pulse train of adjustable frequency. This frequency is so adjusted by means of the control member 10 that when the discharging current of the battery is not high enough to produce at the resistor 3 a sufficient voltage drop to actuate the changer 5 but is, nevertheless high enough to cause the instrument to produce an erroneous reading, in the case of a protracted period of no-load on the battery if entirely neglected, this discharging current is taken into consideration by the application of auxiliary pulses via the OR-gate 8. The output of the OR-gate 8 is applied to the measuring input 12 of a digital counter or meter 11 which serves as an integrating element and which takes the form, for example, of a up-down or forward-backward meter with four decades. This meter runs backward under charge and forwards under discharge, so that it delivers and stores a digital output signal which indicates the resultant ampere-hours consumption, starting from a predetermined fully charged condition. To control the reversal of the integrating element or of the meter 11 in accord with the charging or discharging of the battery, there is connected in series with a forward-backward control input 13 of the meter 11, a polarity comparator 14 which is controlled in accord with the polarity of the output voltage of the measuring amplifier 4.

At the output of the digital meter 11 there is located a digital-analogue converter 15, which delivers an analogue voltage corresponding to the digital content of this meter. This voltage has a zero value at full charge of the battery 1 and increases with rising discharge.

Figure 1:
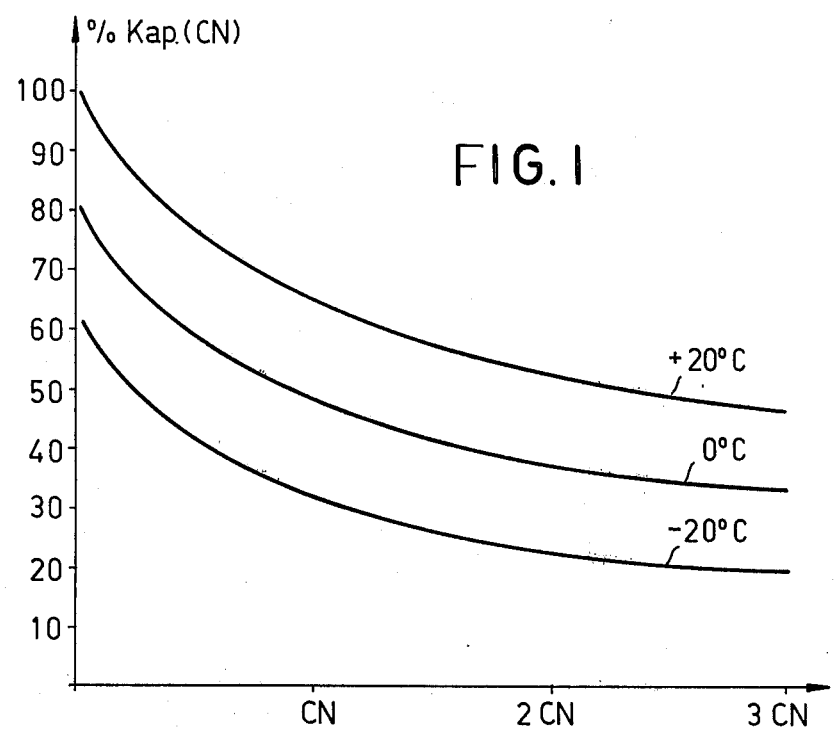
FIG. 1 illustrates the temperature-dependent ampere-hours/ampere characteristic curves of a conventional lead battery, expressed in percentages of the rated capacity (CN) of the battery.

There is also connected up to the measuring amplifier 4 a load-curve computer 18 which is programmed according to the relationship between discharge current, temperature and ampere-hours consumption, as represented in FIG. 1, and is controlled, on the one hand, at an input 19 by the measuring amplifier 4 in accordance with the particular discharge current and, on the other hand, at an input 20 by a temperature sensor 21 in the battery 1 in accordance with the operating temperature thereof, so that said computer delivers at its output 22 an analogue voltage which indicates the quantity of ampere-hours which can be taken at that particular discharge current and operating temperature.

As indicated in FIG. 3 by means of a chain line, the output 22 of the load-curve computer 18 can be connected directly to input 24 of a comparator 23, to whose other input 25 is connected to the analogue voltage of the digitalanalogue converter 15. The comparator 23 in this case may be an indicating instrument, which determines the difference in the voltages at its inputs 24 and 25. The voltage active at the input 24 indicates, as already mentioned, the quantity of ampere-hours which generally can be taken from the battery 1 at the particular discharge current and operative temperature, taking into account the non-linear characteristic curve of the battery. The voltage at the input 25 indicates the ampere-hours quantity which has already been taken from the battery, starting from a predetermined full-charge condition. The potential difference thus indicates the quantity of ampere-hours which can still be taken at the prevailing battery charge condition at the particular discharge current and at the operative temperature. The dial of the indicating instrument may be directly calibrated in ampere-hours values or in percentages of the rated capacity of the battery 1 and the instrument can thus be used on electric vehicles with a traction battery in a similar way to a fuel gauge on motor vehicles with internal combustion engine.

Figure 2:
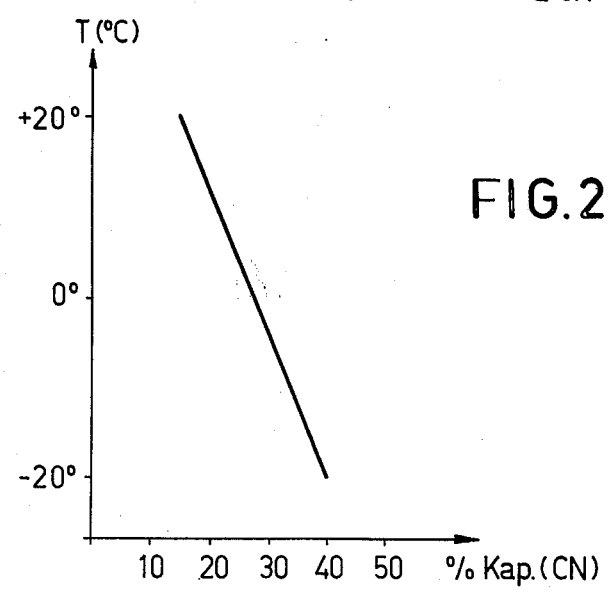
FIG. 2 shows, for example for a starter battery, the minimum ampere-hours quantity necessary to ensure starting capability, as a percentage of the rated capacity of the battery in dependence on temperature.

In order to obtain an indication as to whether the charge condition of the battery 1 at the operative temperature can meet a predetermined minimum ampere-hours requirement, the signal at the output 22 of the load-curve computer 18, as represented in solid lines in FIG. 3, acts on one input 27 of a compensating curve computer 26, which is programmed, according to the characteristic curve in FIG. 2, in accordance with the combination of minimum ampere-hours requirement and temperature, the output of the temperature sensor being applied to a second input 28 of the computer 26. The analogue signal at the output 29 of this compensating curve computer 26 then acts on the input 24 of the comparator 23, whose other input 25 is acted on once more by the converter 15. At the output of the comparator 23 there is arranged a tipping switch stage 30, which responds in each case when the reference signal is equal to or less than zero to deliver an output signal which acts on an indicating instrument 31, which can deliver, for example, a visual or audible signal.

The above-described instrument may be used, for example, advantageously on motor vehicles in conjunction with the starter battery so as to warn the driver when the battery has run down to such an extent, due to current consumption during service life, that its starting capability is jeopardized. The characteristic curve, according to FIG. 2 utilised by the compensating curve computer 26, then indicates the minimum percentage of the rated capacity of the battery 1 at the operative temperature, which still must be available to ensure satisfactory starting. This characteristic curve is determined empirically. With regard to the already described control voltages at the inputs 27 and 28 the output voltage of this compensating curve computer 26 indicates the quantity of ampere-hours which can be taken from the battery 1 at the operative temperature and at the particular discharge current until reaching a residual capacity which can still ensure starting capability. In the case of equality of the signals at the inputs 24 and 25 of the comparator, this minimum percentage of the rated capacity is attained and the indicating instrument then delivers the warning indication that no further electricity should be consumed during the service life of the battery, if the starting capability of the motor vehicle is to be maintained.

What we claim is:

1. An apparatus for measuring the charge condition of a secondary cell, comprising, in combination:
    electric sensing means coupled to said cell and operable for producing a first signal substantially proportional to current flowing in or out of said cell;
    first conversion means coupled to said first signal and operable for producing a second signal substantially proportional to the consumed ampere-hours of said cell measured from a predetermined full charge condition and compensating for any subsequent charging;
    a temperature sensor operable for producing a third signal as a function of the temperature near said cell;
    second conversion means coupled to said first and third signals and operable for producing a fourth signal substantially proportional to the estimated available ampere-hours of said cell with respect to said full charge condition as a function of said first signal, and said third signal; and
    a comparator coupled to said second and fourth signals and operable for producing a fifth signal representing the relative amplitudes of said second and fourth signals, whereby said fifth signal represents a measure of the charge condition of said cell.

2. An apparatus for measuring the charge condition of a secondary cell, comprising, in combination:
    electric sensing means coupled to said cell and operable for producing a first signal substantially proportional to current flowing in or out of said cell;
    first conversion means coupled to said first signal and operable for producing a second signal substantially proportional to the consumed ampere-hours of said cell measured from a predetermined full charge condition and compensating for any subsequent charging;
    a temperature sensor operable for producing a third signal as a function of the temperature near said cell;
    second conversion means coupled to said first and third signals and operable for producing a fourth signal substantially proportional to an estimated predetermined minimum ampere-hours requirement of said cell as a function of said first signal, and said third signal; and
    a comparator coupled to said second and fourth signals and operable for producing a fifth signal representing the relative amplitudes of said second and fourth signals, whereby said fifth signal represents a measure of the charge condition of said cell.

3. The apparatus as claimed in claim 2, further comprising a signal device coupled to said fifth signal and operable for indicating when said second signal exceeds said fourth signal.

4. The apparatus as claimed in claim 2, wherein said electric sensing means comprises a resistor connected in series with said cell and an amplifier connected in parallel with said resistor.

5. The apparatus as claimed in claim 2, wherein said first conversion means comprises a voltage controlled pulse generator having a pulse signal rate controlled by the amplitude of said first signal and an up-down counter coupled to said pulse generator.

6. The apparatus as claimed in claim 5, wherein said pulse generator comprises control means operable for adjusting the response of said pulse generator to be a predetermined factor according to the polarity of said first signal.

7. The apparatus as claimed in claim 5, wherein said first conversion means comprises another pulse generator coupled to said first signal and operable for producing a pulse signal having a predetermined rate when said first signal is substantially zero, and an OR gate having its input terminals connected to said pulse generators and its output terminals connected to said counter.

8. The apparatus as claimed in claim 7, wherein said first conversion means includes a digital-to-analog converter coupled at its input terminals to said counter and at its output terminals to said comparator.

* * * * *